(12) United States Patent
Gudesen et al.

(10) Patent No.: US 6,541,869 B1
(45) Date of Patent: Apr. 1, 2003

(54) SCALABLE DATA PROCESSING APPARATUS

(75) Inventors: Hans Gude Gudesen, Brussels (BE); Per-Erik Nordal, Asker; Geirr I. Leistad, Sandvika, both of (NO); Rolf Magnue Berggren, Vreta Kloster (SE); Bengt Göran Gustafsson; Johan Roger Axel Karlsson, both of Linköping (SE)

(73) Assignee: Thin Film Electronics ASA, Oslo (NO)

( * ) Notice: Subject to any disclaimer, the term of this patent is extended or adjusted under 35 U.S.C. 154(b) by 0 days.

(21) Appl. No.: 09/601,457

(22) PCT Filed: Dec. 3, 1999

(86) PCT No.: PCT/NO99/00365

§ 371 (c)(1),
(2), (4) Date: Sep. 18, 2000

(87) PCT Pub. No.: WO00/38234

PCT Pub. Date: Jun. 29, 2000

(30) Foreign Application Priority Data

Dec. 4, 1998 (NO) .................................................. 985707

(51) Int. Cl.[7] .......................... H01L 23/48; H01L 23/52
(52) U.S. Cl. ..................................... 257/777; 257/776
(58) Field of Search ................................ 257/777, 776

(56) References Cited

U.S. PATENT DOCUMENTS

| 5,375,085 | A |   | 12/1994 | Gnade et al. |
| 5,383,269 | A |   | 1/1995  | Rathmell et al. |
| 5,656,548 | A |   | 8/1997  | Zavracky et al. |
| 5,714,768 | A |   | 2/1998  | Ovshinksy et al. |
| 5,801,439 | A | * | 9/1998  | Fujisawa et al. |
| 6,133,626 | A | * | 10/2000 | Hawke et al. |
| 6,236,109 | B1| * | 5/2001  | Hsuan et al. |

FOREIGN PATENT DOCUMENTS

| JP | A63186457 | 8/1988 |
| WO | A1-9509438 | 4/1995 |

OTHER PUBLICATIONS

Dodabalapur et al., Appl. Phys. Lett., vol. 68, No. 16, pp. 2246–2248 (1996).

"Ultrafast Nonvolatile Ferroelectric Information Storage Device", IBM Technical Disclosure Bulletin, vol. 37 No. 11, Nov. 1994 pp. 421–424.

* cited by examiner

Primary Examiner—Stephen D. Meier
(74) Attorney, Agent, or Firm—Birch, Stewart, Kolasch & Birch, LLP

(57) ABSTRACT

In a scalable data processing apparatus, particularly a data storage apparatus, one or more thin-film devices which form a substantially planar layer comprise a plurality of sublayers of thin film. Two or more thin-film devices are provided as an integrated stack of the substantially planar layers which form the thin-film devices, such that the apparatus thereby forms a stacked configuration. Each thin-film device comprises one or more memory areas which form matrix addressable memories and additionally circuit areas which form electronic thin-film circuitry for controlling, driving and addressing memory cells in one or more memories. Each memory device has an interface to every other thin-film device in the apparatus, said interfaces being realized with communication and signal lines as well as supporting circuitry for processing extending vertically through dedicated interface areas in the thin-film device.

47 Claims, 8 Drawing Sheets

SCALABLE DATA PROCESSING APPARATUS

Figure 1A:
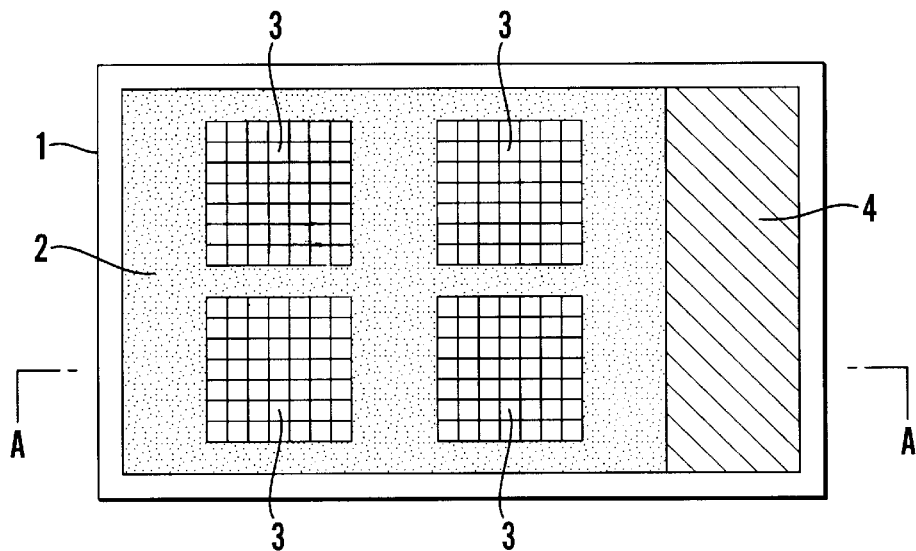

This application is the national phase under 35 U.S.C. § 371 of PCT International Application No. PCT/NO99/00365 which has an International filing date of Dec. 3, 1999, which designated the United States of America.

The present invention concerns a scalable data processing apparatus, particularly a data storage apparatus, comprising one or more thin-film devices which form a substantially planar layer generated by a number of sublayers of thin film, wherein the sublayers of thin film comprise electrical isolating and/or conducting and/or semiconducting structures and structures with information storage capability realized in a thin-film material in a sublayer, wherein the structures register with or contact electrically other structures of this kind in adjacent sublayers for realizing active and passive electronic circuits elements or logic cells in the thin-film device, wherein the active and passive circuit elements in a thin-film device are realized with a three-dimensional architecture and extend through two or more sublayers, wherein the circuit elements are electrically connected by horizontal electrical conducting structures in one or more sublayers and vertical electrical conducting structures extending through one or more of the sublayers, and wherein two or more thin-film devices are provided as an integrated stack of the substantially planar layers which form the thin-film devices, such that the apparatus forms a stacked configuration.

It is known in the art to create memory devices in the form of thin-film circuits in stacked configurations and wherein a memory device additionally may be combined with processors for controlling driving and addressing the memory, but then with the latter realized in inorganic semiconducting materials, either in the form of single crystal rigid substrates and/or thin-film provided on a carrier substrate which very well may be exceptionally thin, for instance formed as films of silicon dioxide. A complete memory device with processing circuits is created by juxtaposition of the layers and often with transfer of the thin-film circuits by means of special methods. In order to provide interconnections between the layers viz. through set of holes in the layers are used and possibly combined with evaporation of metal in order to create the necessary current paths. Further there is from PCT/NO99/00180 which belongs to the present applicant and which hereby is incorporated by reference, known an integrated scalable data processing device which forms a complete computer with a mass memory and a combined processor and memory module wherein either in separate processor layers or separate memory layers or combined processor and memory layers are provided so-called intelligent random access memories (IRAM) and processors which realize the CPU function of the computer or which realize control and communication functions in the computer. In order to provide short current paths three-dimensional electrical structures are used to create interconnections between components in the separate layers and between the layers mutually. The whole data processing device is provided on a substrate which contains further high-speed processing circuits for control and communication purposes, these being realized with inorganic semiconducting materials in conventional technology, while the different layers of the data processing device otherwise wholly are realized in thin-film technology whether they concern processors or memories.

Even though in the art known devices for data processing and storage based on the use of thin-film technology carry a number of advantages with regard to speed and functionality, they are for purely storage purposes often very costly and can particularly be complicated to produce. An effective memory management further requires a substantial processing capacity, for instance for control, communication and addressing, dedicated circuits for these purposes often being assigned a large memory or several separate memories with large storage capacity.

The main object of the present invention is to provide a scalable data processing apparatus, particularly a data storage apparatus which is relatively simple and inexpensive to make and which in principle allows for almost unlimited scaling of the data storage capacity without the management and operation of the memory becoming complicated.

A further object of the invention is to realize a scalable data processing apparatus, particularly a data storage apparatus substantially in thin-film technology which allows implementation of supporting functions for control and addressing of memories realized in thin-film technology, the electronic circuits for the mentioned purposes to be integrated with memories in the thin-film device.

Finally it is also an object of the present invention to realize a volumetric data storage device with large storage density, fast data access and high data transfer rate, optionally combined with parallel input of data in the data memory and fast parallel readout of data therefrom.

The above-mentioned and other objects are achieved according to the invention with a scalable data processing apparatus particularly a data storage apparatus, which is characterized in that each thin-film device comprises one ore more memory areas which form one or more matrix addressable memories, each with a memory medium in a sublayer in contact with a first electrode set in the form of stripe-like parallel electrical conducting structures or electrode structures and a second electrode set in the form of corresponding electrode structures oriented substantially orthogonal to the electrode structures in the first electrode set, the electrode sets respectively being provided in respective further sublayers adjacent to said sublayer on each side thereof, whereby addressable memory cells are created in the memory medium at the crossings between the electrode structures in the first and the second electrode set, that each thin-film device further comprises circuit areas which form electronic thin-film circuitry for controlling, driving and addressing the memory cells in one or more memories, said electronic circuitry being connected with electrode structures in respective the first and the second electrode set in a memory over current paths which are formed as electrical conducting structures in substantially the same sublayers wherein the electrode sets are provided, and that each thin-film device has a respective interface to every other thin-film device in the apparatus, said interfaces being realized with communication and signal lines and supporting circuitry for processing which extends vertically through respective dedicated interface areas in the thin-film device.

In an advantageous embodiment of the apparatus according to the invention the memory medium in one or more memories comprises materials selected among molecular materials in the form of monomers, oligomers or polymers, carbon-containing materials in inorganic or organic form, or a juxtaposition or mixture of such materials. In this connection it is preferred that the memory medium comprises a memory material which in a memory cell provides a non-linear current/voltage characteristic, said non-linear current/voltage characteristic being venerated by inorganic or organic diodes or a threshold-switchable material.

In another advantageous embodiment of the apparatus according to the invention the memory medium comprises a switchable material, said switchable material being a non-volatile material, selected as respectively a ferroelectric material or a charge transfer organic complex, or the memory medium can be switchable and have a non-linear current/voltage characteristic.

Advantageously can according to the invention the electronic circuitry comprise inorganic and/or organic semiconducting materials.

In an advantageous embodiment of the apparatus according to the invention the interface areas in one or more thin-film devices are provided integrated in an edge portion of this or these, said edge portions in the latter case registering mutually. In this connection it is preferred that the interface area in an edge portion additionally comprises an I/O interface for the respective thin-film device or optionally the apparatus as a whole, and implements functions for data and signal communication with external and/or peripheral devices.

Advantageously can in the apparatus according to the invention the thin-film device or the stacked configuration of such devices be that the thin-film device or the stacked configuration of such devices be provided on a substrate which comprises active electronic circuits for implementing additional control, driving and communication functions in the apparatus, each thin-film device being connected with a circuit over a separate interface area which in each case extends vertically through the thin-film devices which are located between a thin-film device in question and the substrate. In this connection it is preferred that the substrate comprises an interface portion that the substrate comprises an interface portion which extends substantially horizontally in the substrate and parallel to and adjacent to the thereabove provided thin-film device and which is electrically connected with the interface portions in thin-film device or the thin-film devices provided above the substrate, and particularly it is preferred that the interface portion that the interface portion further comprises an I/O interface for the apparatus as a whole, said I/O interface implementing functions for data- and signal communication with external and/or peripheral devices.

It is then also advantageous that the substrate is made in a semiconducting material, particularly an inorganic single crystal semiconducting material and even more particularly such a single crystal semiconducting material of silicon, and particularly it is in this connection preferred that the electronic circuits in the substrate are realized in CMOS technology. Further it is in this connection preferred that electrical connections between the electronic circuits in the substrate and its interface portion or over this interface portion to the interface areas in the above-lying thin-film devices are realized as CMOS-compatible metallic interconnections.

In an advantageous embodiment of the apparatus according to the invention wherein the apparatus comprises two or more thin-film devices, the thin-film devices are substantially conformal in the plane and provided mutually registering in the stacked configuration. In this connection it is preferred that one or more separation layers are provided interfoliated between adjacent thin-film devices and implementing either separately or in selected combinations respectively an electrical, thermal, optical or mechanical isolating function or a planarizing function, said interface areas in the respective thin-film devices in each case being electrically connected over vias in a respective separation layer.

In another advantageous embodiment of the apparatus according to the invention, wherein the apparatus comprises two or more thin-film devices, the thin-film devices are provided mutually staggered in the stacked configuration. In this connection it is preferred that one or more separation layers are provided interfoliated between adjacent thin-film devices and separately or in selected combinations implement respectively an electrical, thermal, optical or mechanical isolating or planarizing function, and that separation layers only are provided in the overlapping portion of two adjacent thin-film devices, the interface areas of the respective thin-film devices being provided above exposed surface portions of the thin-film devices in staggered area thereof, such that the separation layers between the thin-film devices form an unbroken layer without vias for electrical connections between the separate thin-film devices.

Finally can the apparatus according to the invention advantageously be provided on a carrier substrate formed of a foil-like material or a rigid material such as silicon, said carrier substrate in each case being provided adjacent to the lowermost thin-film device in the stacked configuration or an optionally provided substrate with electronic circuits.

Figure 1B:
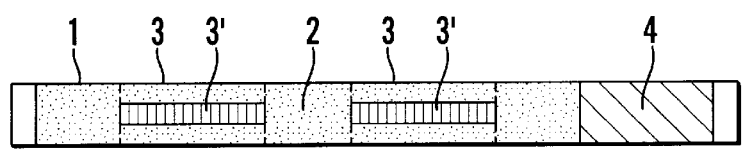

The scalable data processing apparatus, particularly data storage apparatus according to the invention, shall now be discussed in more detail in the following with reference to exemplary embodiments and the accompanying drawings, wherein FIG. 1a shows a plan view of a thin-film device used in the apparatus according to the present invention, FIG. 1b a section through a first embodiment of the thin-film device in FIG. 1a, taken along the line A—A, FIG. 1c a section through a second embodiment of the thin-film device in FIG. 1a, taken along the line A—A, FIG. 2a a plan view of a third embodiment of the thin-film device used in the apparatus according to the present invention.

Figure 2A:
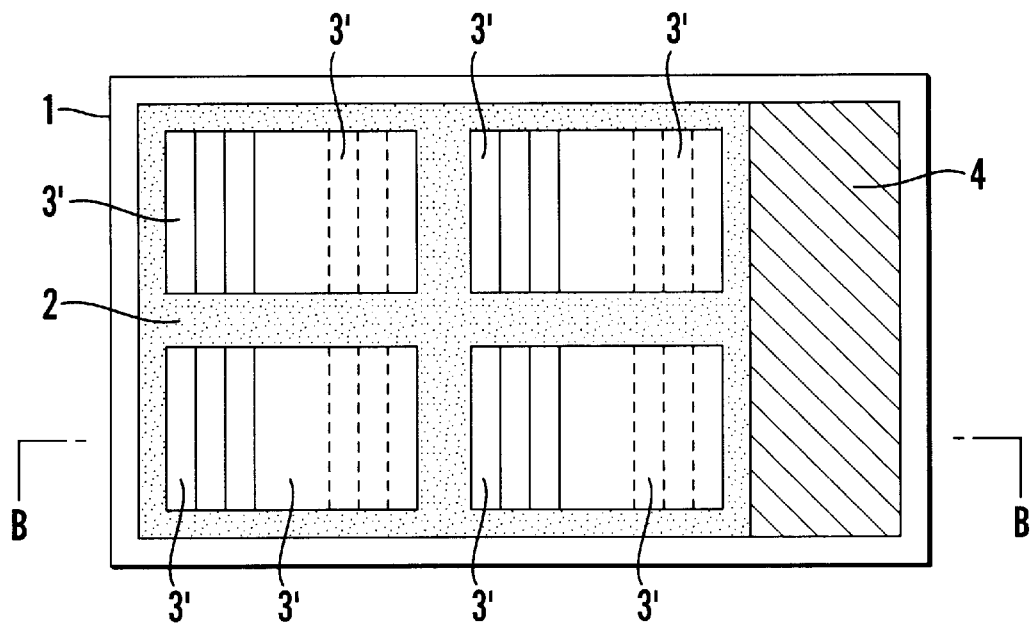
Figure 2B:
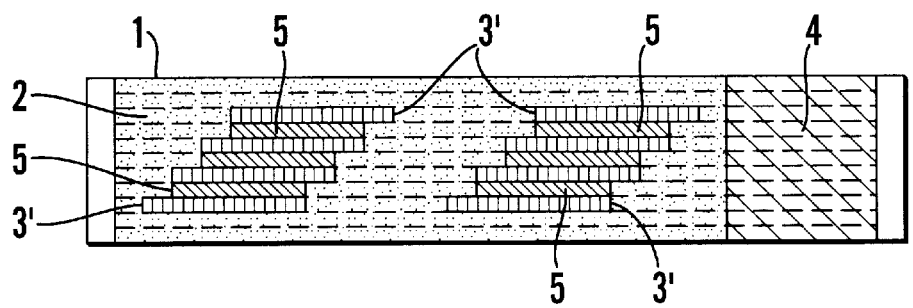
Figure 3A:
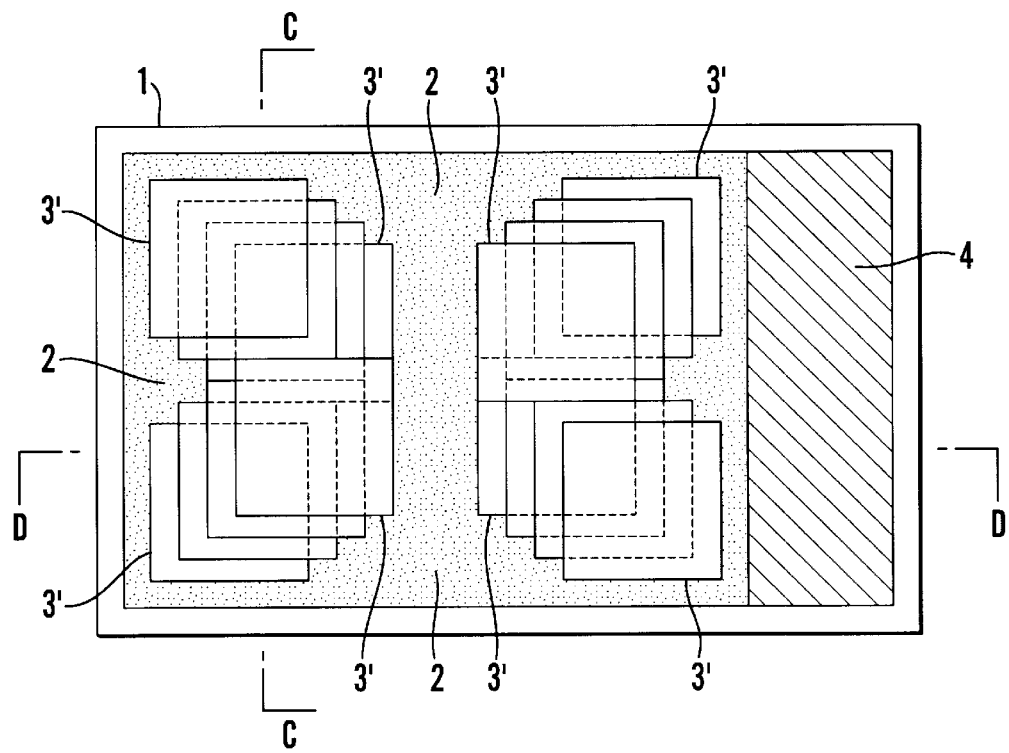

FIG. 2b a section through the thin-film device in FIG. 2a, taken along the line B—B, FIG. 3a a fourth embodiment of the thin-film device used in the apparatus according to the present invention.

Figure 3B:
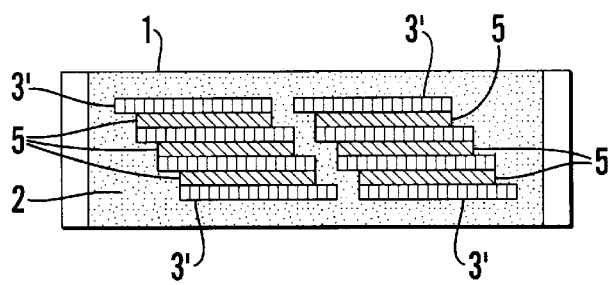
Figure 3C:
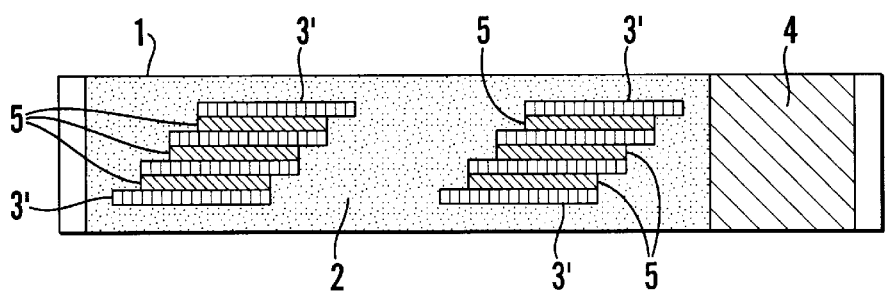
Figure 4:
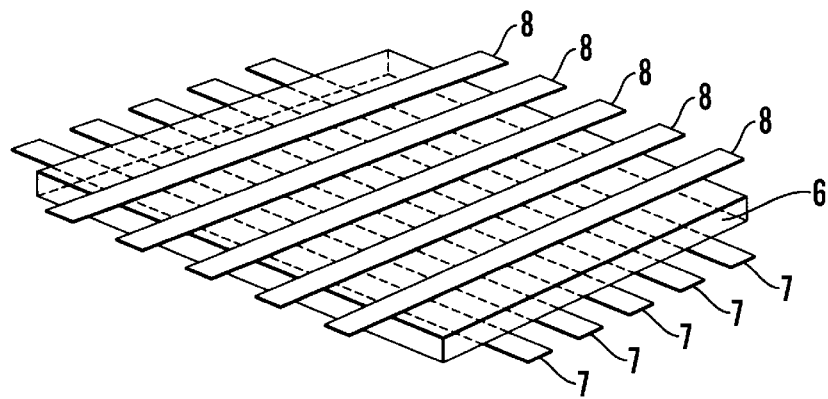
Figure 5A:
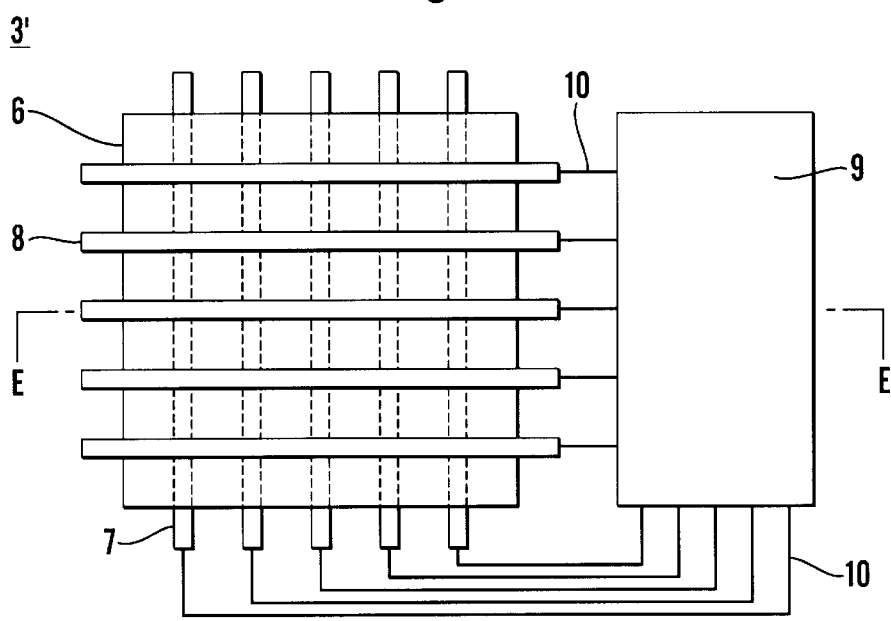
Figure 5B:
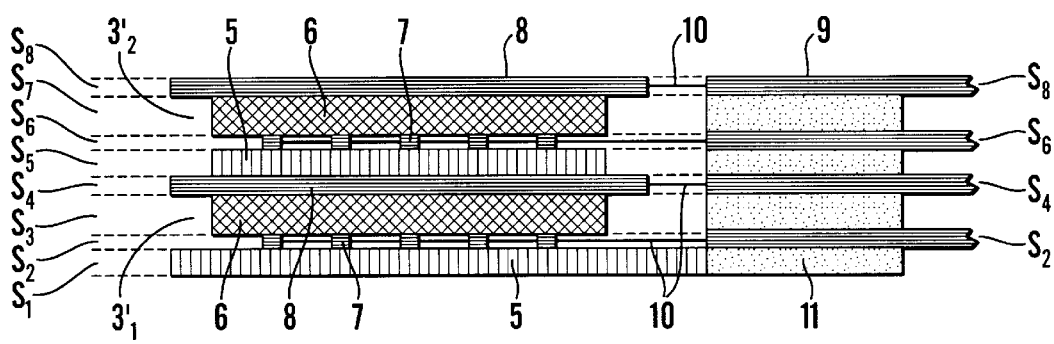
Figure 6A:
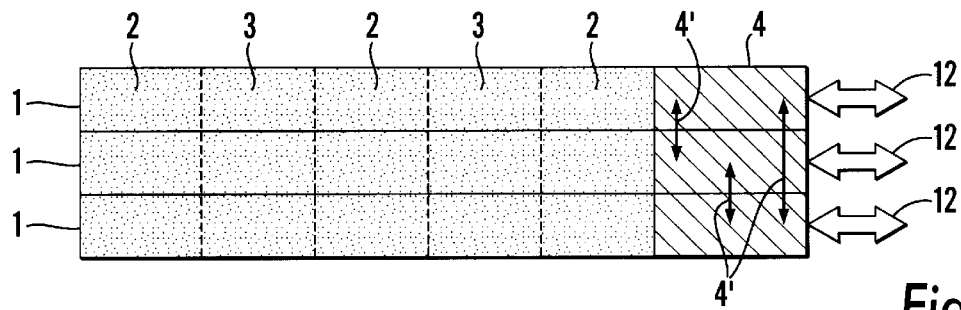
Figure 6B:
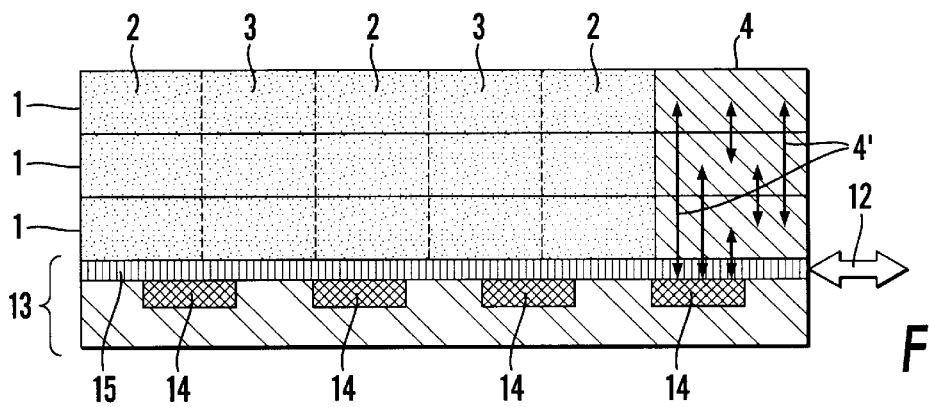
Figure 6C:
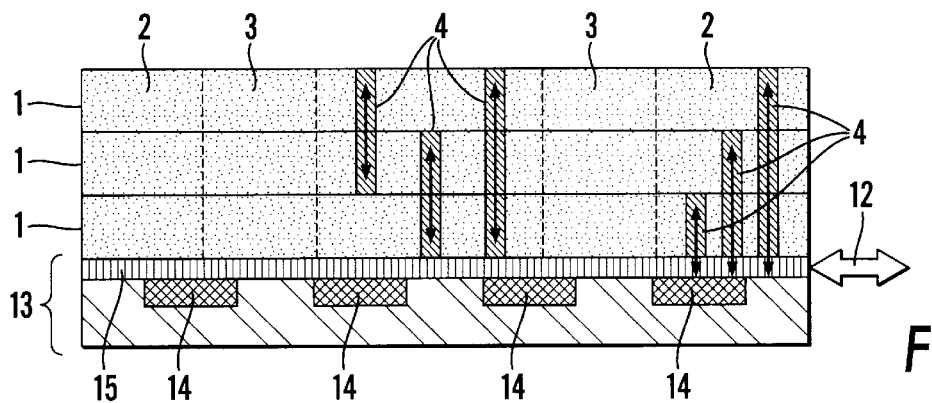
Figure 7:
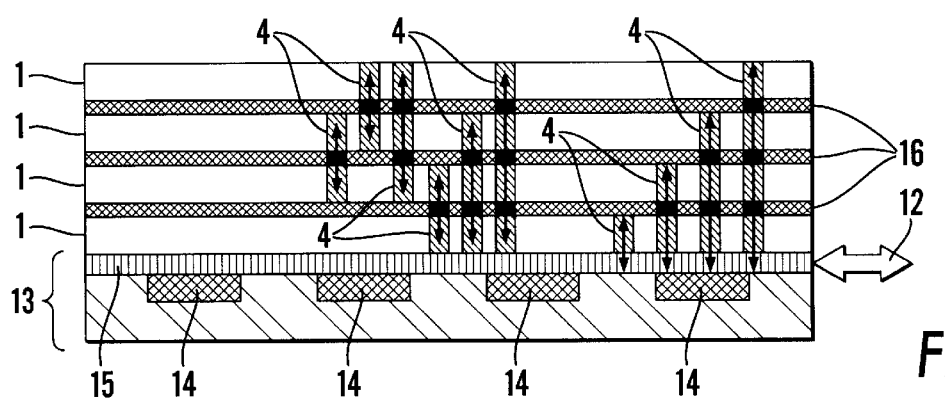
Figure 8A:
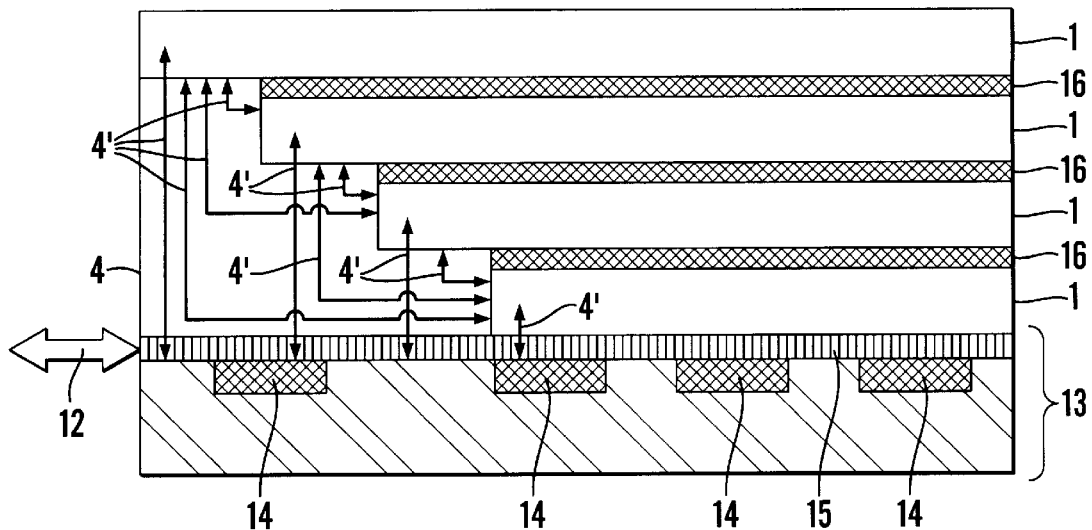
Figure 8B:
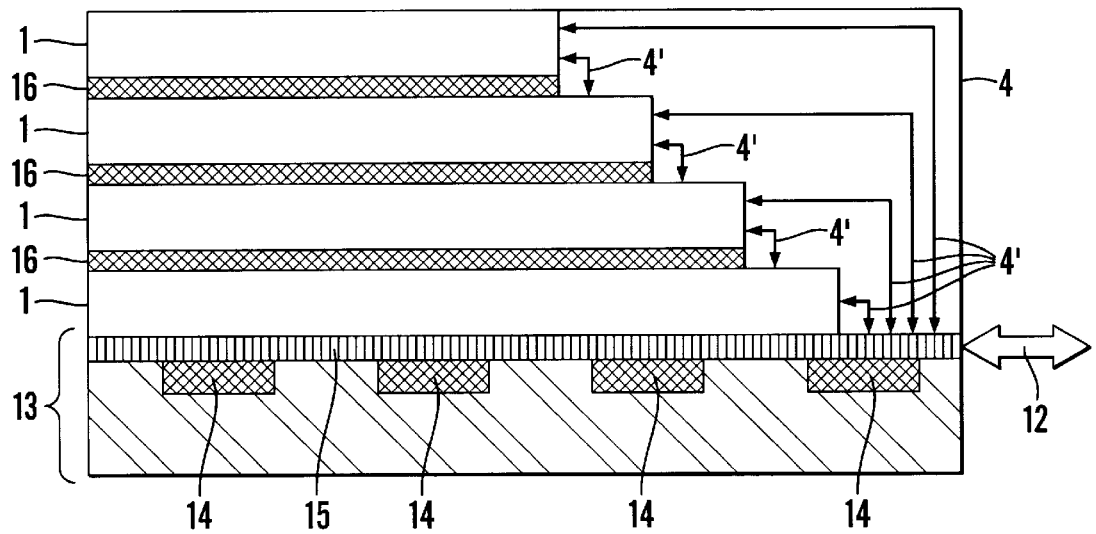
Figure 9:
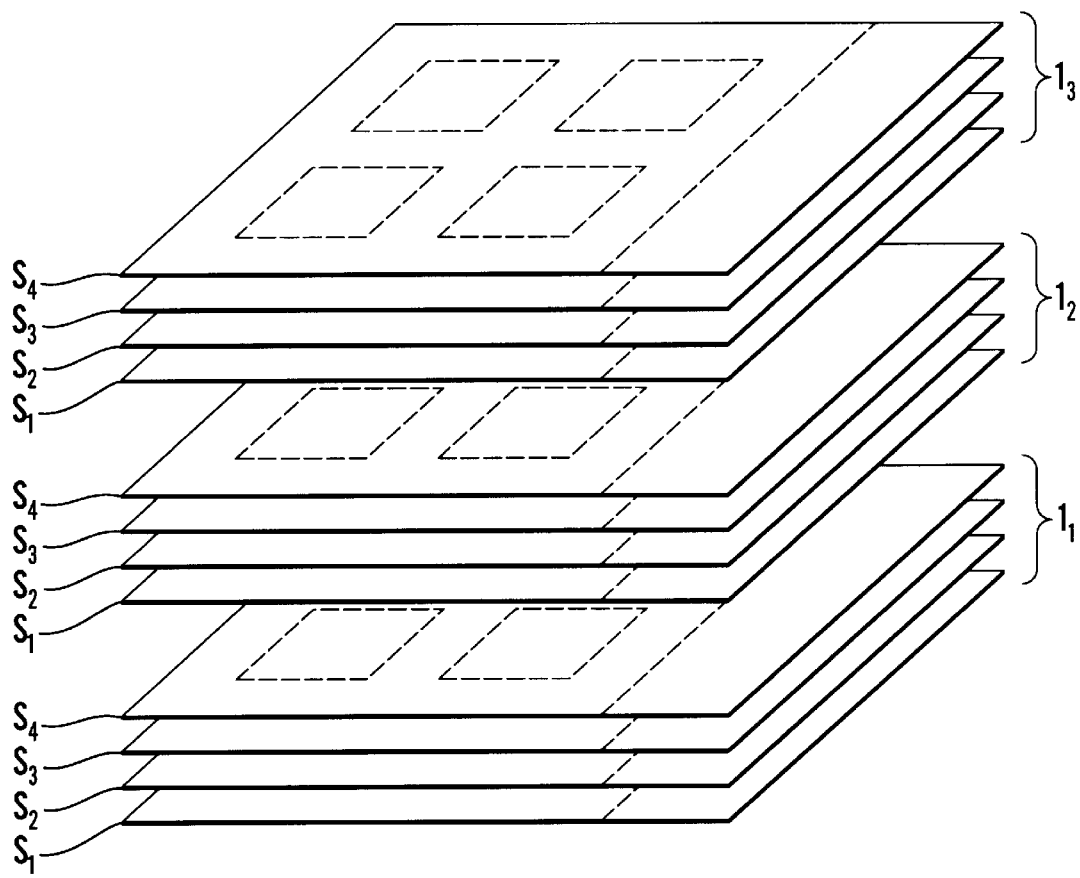
Figure 10:
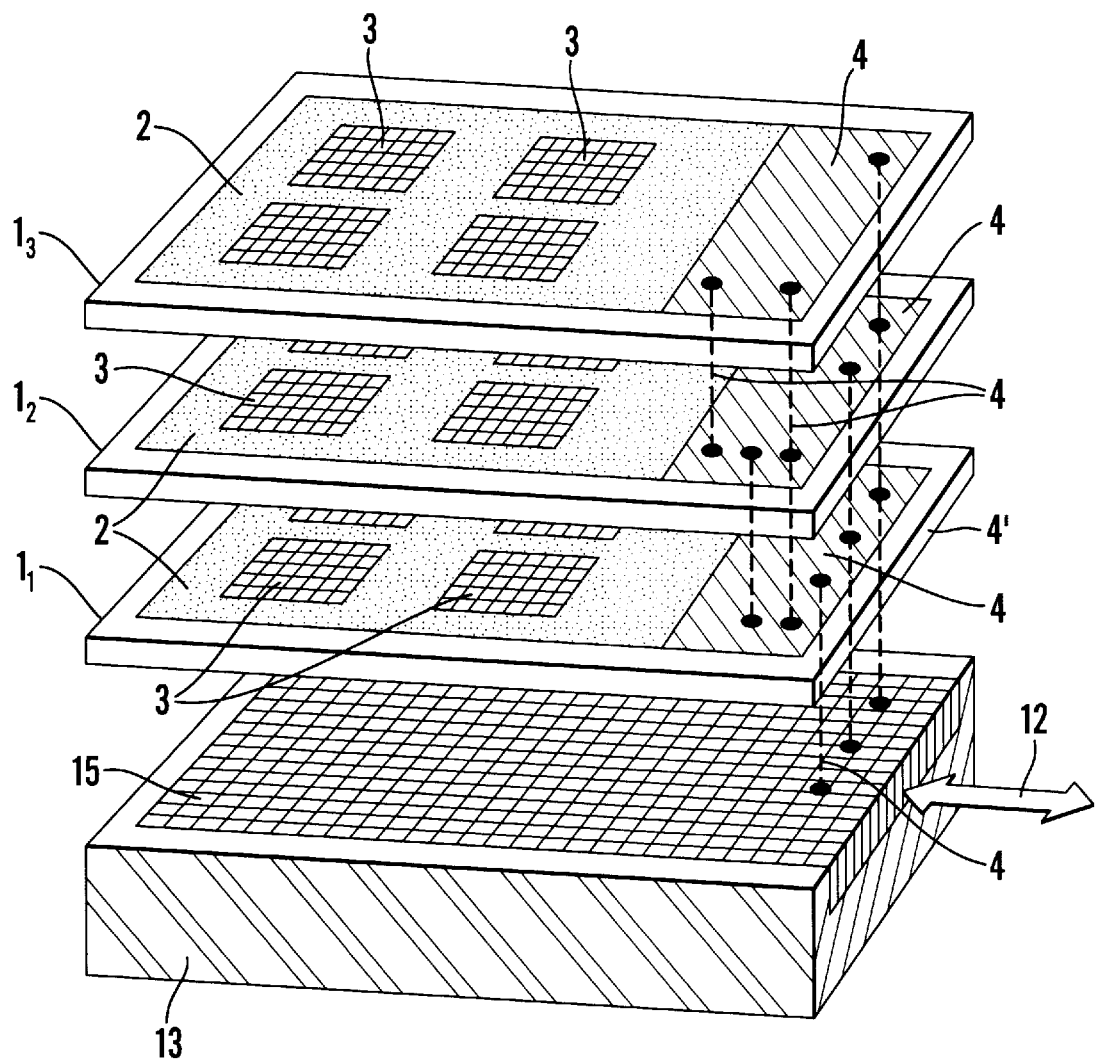

FIG. 3b a section through the thin-film device in FIG. 3a, taken along the line C—C, FIG. 3c another section through the thin-film device in FIG. 3a, taken along the line D—D, FIG. 4 schematically and in perspective an embodiment of a matrix-addressable memory as used in the thin-film device in one of the FIGS. 1–3, FIG. 5a a plan view of the matrix-addressable memory in FIG. 4 connected with an active electronic circuit in a thin-film device as shown in one FIGS. 1–3, FIG. 5b a schematic section through the memory in FIG. 5a, taken along the line E—E, FIG. 6a a first embodiment of the apparatus according to the present invention, FIG. 6b a second embodiment of the apparatus according to the present invention, FIG. 6c a third embodiment of the apparatus according to the present invention, FIG. 7a fourth embodiment of the apparatus according to the present invention, FIGS. 8a and 8b variants of a fifth embodiment of the apparatus according to the present invention, FIG. 9 schematically the joining of sublayers in thin-film technology into a thin-film device as used in the present invention and the joining of several such thin-film devices into an apparatus according to the invention, and FIG. 10 schematically a preferred embodiment of the apparatus according to the present invention exploded in its main components.

The main object of the present invention is to provide a data storage device and the apparatus according to the invention will hence in the following be regarded to realize a memory device and be termed as "apparatus". The basis of the present invention is that the apparatus can be realized in the form of mutually adjacent and substantially parallel stacked layers, each of these stacked layers being formed as a thin-film device which in its turn is composed of a plurality of sublayers of thin film with specific and different functions and possibly made of different materials.

A thin-film device 1 as used in the present invention is shown in plan view in FIG. 1a. The thin-film device 1 is organized respectively in a circuit area 2, memory areas 3 and an interface area 4. In FIG. 1b there is shown a section through the thin-film device in FIG. 1c taken along the line A—A. The memory areas 3 which contain memories 3' realized in thin-film technology, are here shown provided within the circuit area 2 which contains thin-film based electronic circuitry for implementing control, communication and addressing functions for the memories. Depending on the memory type the addressing function will for instance comprise writing, reading and erasing in the memory, as well as communication to and from the memory over the interface area 4. FIG. 1c shows a section through the thin-film device in FIG. 1a, also taken along the line A—A, but here in another embodiment than that in FIG. 1b, the memory areas 3 here being shown with vertically stacked thin-film memories 3' in the circuit area 2, but mutually isolated by electrical isolating layers 5. It is in this connection to be understood that also each separate memory 3' of course is constituted by a number of separate sublayers, such as will be discussed in more detail in the following, and further the not in particular shown electronic circuitry in the circuit area 2 over the interface area 4 not only is used for controlling and addressing of memories in the separate thin-film device, but also communicates with corresponding circuitry and other memories in adjacently provided thin-film devices 1.

Figure 1C:
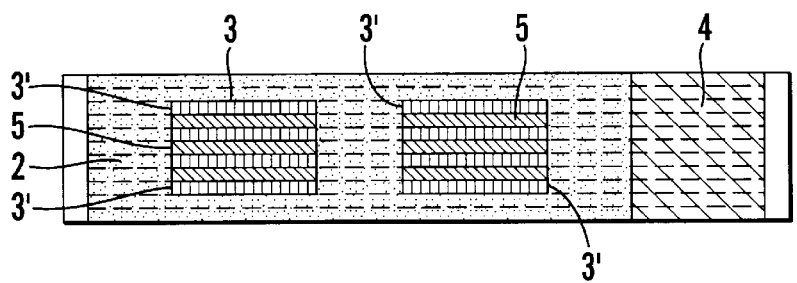

It is the circumstance that each separate thin-film device 1 is composed of a large number of sublayers, typically for instance several tens, while the separate memory 3' does not need to comprise more than four to five sublayers, which allows several memories to be stacked, either vertically as shown in FIG. 1c or in another advantageous embodiment as shown in plan view in FIG. 2a and in FIG. 2b taken in section along the line B—B in FIG. 2a. Here the separate memories 3' in the thin-film device 1 again are provided stacked, but mutually staggered. In FIGS. 2a and 2b there are shown four memory stacks with four memories 3' and mutually isolated by electrical isolating layers 5. Only respectively the lowermost and the uppermost memory in each stack are indicated with the reference number 3'.

Another embodiment of the thin-film device 1 as used in the present invention is shown in FIG. 3a which substantially corresponds to the embodiment in FIG. 2a and with the memory stacks created with the memories staggered, but now along a diagonal line such the stack appears as shown in plan view in FIG. 3a, in section in FIG. 3b taken along the line C—C in FIG. 3a, and in section in FIG. 3c taken along the line D—D in FIG. 3a. An arrangement of the memory in the stack as shown in respectively FIG. 2a and FIG. 3a can be advantageous with regard to better exploitation of the real estate in the circuit area 2, while the staggering can simplify the interconnection between memories and electronic circuitry in the circuit area 2. It is of course to be understood that the mutual arrangement of the memories 3' in the memory area 3 in the circuit area 2 essentially is not limited to some specific geometry, but may be varied within boundaries given by the embodiment and the form factor of the thin-film device 1.

FIG. 4 shows schematically the embodiment of an essentially passive matrix addressable memory 3'. A memory of this kind is for instance disclosed in PCT/NO98/00185 which belongs to the present applicant and which hereby is incorporated by reference. In FIG. 4 a memory medium 6 is provided in sandwich with respectively an underlying electrode set consisting of parallel stripe electrodes 7 and an overlying electrode set consisting of parallel stripe electrodes 8. By applying a voltage to respectively an underlying and an overlying electrode 7;8, there will in a memory medium 6 at the crossing between the electrodes be obtained a change of state which for instance can be expressed by change in the impedance in the memory medium. The memory medium 6 itself will preferably be made of a molecular material, or a carbonaceous inorganic or organic material. Usually it will be desirable that the memory medium shall have a non-linear impedance characteristic, and by addressing a not shown memory cell formed in the crossing between an underlying electrode 7 and an overlying electrode 8, it will be desirable to prevent the generation of so-called sneak currents to other memory cells in the memory matrix. This can advantageously be achieved by providing the memory medium with rectifying properties, preferably by incorporating a layer which forms a diode junction or by the memory medium 6 itself spontaneously forming a diode junction with the electrode material.

If the memory material 6 is a polymer, its information storage capability can depend on a chance of an impedance value thereof under applied electric current or voltage and keeping this changed impedance value also after the current or voltage has been turned off. The memory can also be a switchable material, for instance a ferroelectrical material in the form of a polymer, the polarization state of which then could represent a determined logic state, or a charge transfer metal organic complex such as M(TCNQ). Generally there is in the art known a number of different memory materials which may be used in matrix-addressable memories and there shall in this connection for instance be referred the above-mentioned publication PCT/NO98/00185. In FIG. 4 the memory is provided in sandwich, but this is, however, no condition and it is wholly possible to employ another electrode configuration, for instance a bridge configuration as disclosed in PCT/NO98/00212 which belongs to the present applicant and where the underlying electrode 7 and the overlying electrode 8 will be mutually isolated in a crossing and the memory material 6 provided over the electrodes, something which, of course, requires that the memory material must have the properties which ensure its information storage capability also in such a case. Typically a memory material in this case may be a conjugated polymer.

The interconnection between the memory 3' an a circuit 9 in the circuit area 2 is shown schematically and in plan view in FIG. 5a. Each of the electrodes 6,7 in the matrix is connected to the circuit 9 via word and bit lines 10. In a section taken along the line E—E in FIG. 5a, the arrangement in FIG. 5a formed as sublayers $S_1$–$S_8$ in the thin-film device 1 will appear as shown in FIG. 5b, where are shown two stacked memories $3'_1$, $3'_2$ and the circuit 9 which wholly are realized in a thin-film technology. Particularly it is to be observed that current paths and conductor paths for the memory 3', that is underlying and overlying electrodes 7;8 as well as the lines 10 which connect the electrodes to the circuit 9, substantially all are provided in the same sublayer, here for instance $S_2$, $S_4$, $S_6$ og $S_8$, something which will make it more easy to generate such current paths and conductor paths in the form of electrical conducting structures in one and the same sublayer, according to purpose.

FIG. 6a shows how several thin-film devices 1, in this case three, are joined into a stacked configuration. As before are the circuit areas are denoted with 2 and the memory areas denoted with 3 and in the figures shown with mutual registration, but this is no condition. The interface area 4 is provided on the side of the circuit areas and registers correspondingly, the electrical connections between the thin-film devices 1 being indicated schematically with arrows 4' and extending vertically through the interface area 4. Further the interface area 4 can be made with I/O interfaces 12 which connect the thin-film devices 1 with not shown external devices or peripheral devices for input and output of data.

FIG. 6b again shows the thin-film devices 1 in stacked configuration, but now provided on a substrate 13 with active electronic circuits 14. This substrate can well be realized in an inorganic semiconducting material, for instance silicon or modifications of silicon, and the active electronic circuits for instance be realized in a CMOS technology. The active electronic circuits 14 in the substrate 13 are intended for control and communication tasks in the management of memories in the thin-film devices and are adapted for co-operating with thin-film circuits in the circuit areas 2 of the thin-film devices 1. This will leave more room in the thin-film devices 1 for memory purposes, as the thin-film circuits in the circuit areas 2 in this case can be restricted to that which is necessary in order to maintain an effective control and driving of the memory while processing tasks, for instance with regard to parallel input and output of data to the memory and for error correction, memory remapping etc. may be handled by processing devices implemented by the active electronic circuits 14 in the substrate. Vertical interconnections 4' in the interface area 4 in the stacked thin-film devices communicate with an interface portion 15 on the substrate 13, and the electrical connection through this interface portion and between the circuits 14 and the vertical interconnections 4' can for instance be provided by metallic vias formed in the interface portion 15, but this must take place in a CMOS-compatible process if CMOS circuits are provided in the substrate. Instead of creating the I/O-interface 12 in the interface area 4 in the stacked thin-film devices, this I/O-interface 12 may now provided in connection with the interface 15 of the substrate.

Another embodiment of the apparatus according to the invention is shown in FIG. 6c. Here as before are thin-film devices again provided in a stacked configuration on the substrate 13, but instead of providing the interface area 4 of the thin-film devices 1 in an edge portion thereof, there are instead provided separate interface areas 4 in order to create vertical interconnections between the thin-film devices 1 and between these and the interface 15 in the substrate 13. This can in its turn contribute to a topologically regarded advantageous layout of the circuit area in the separate thin-film device and reduce the need for horizontal current paths therein.

In a variant of the embodiment in FIG. 6c the apparatus can be realized as shown in FIG. 7. Here separation layers 16 are provided between each thin-film device 1, such these layers for instance are known from NO patent application no. 98 0781 which belongs to the present applicant and which is hereby incorporated by reference. These separation layers can either separately or in selected combinations implement for instance an electrical, thermal optical or mechanical isolating function. In a stacked configuration they may also be used as planarization layers. When the interface areas 4 in the thin-film devices 1 are provided as shown in FIG. 7, this however presupposes that the are run through the separation layers 16 and this must be done by interconnections for instance in the form of vias in the separation layers, something which in regard to the isolating function may be detrimental and additionally also lead to cost-increasing fabrication steps.

One way to avoid this is to provide thin-film devices 1 as before in the stacked configuration, but now mutually staggered.

An embodiment of this is shown in FIG. 8a where the thin-film devices once again are provided on a substrate 13 and mutually separated by separation layers 16, but where the interface area 4 is provided between the interface 15 in the substrate 13 and above the exposed steps in the thin-film devices on the side thereof. The interconnections between the thin-film devices 1 mutually or between these and the substrate 15 are schematically indicated by respectively horizontal and vertical interconnections 4'.

In the embodiment in FIG. 8a may further a not shown carrier substrate be provided adjacent to thin-film device 1 on the opposite side of the stacked configuration. In the fabrication can then the arrangement of the thin-film devices 1 take place from the not-shown carrier substrate and upwards, whereafter the substrate 13 with active electronic circuits 14 is provided on top of the stacked configuration as a last step in the fabrication process. This implies that the interconnections over the interface area 4 and to the interface portion 15 are realized after the placement of the thin-film devices 1 in a preceeding fabrication step, something which in a number of cases may be advantageous both with regard to costs and a simplification in the creation of the interconnections.

FIG. 8b shows an approximately corresponding embodiment to that in FIG. 8a, with thin-film devices 1 provided mutually separated by separation layers 16 and once again provided staggered in a stacked configuration, such that the thin-film device 1 closest to the substrate 13 does not cover this wholly, but forms a step down to the surface of the substrate. Then once again the interface area 4 may be provided above the stepped portions in the stacked configuration and interconnections between the thin-film devices 1 mutually or between these and the interface 15 in the substrate 13 extending horizontally and vertically over the steps in the stacked configuration.

FIG. 9 shows quite schematically how each separate thin-film device $1_1$; $1_2$; $1_3$ are constituted by a number of sublayers, here shown as four layers $S_1$–$S_4$. Horizontal electrical interconnections can be created as an integrated part of a sublayer s by a conversion of thin-film material in this sublayer and correspondingly can vertical electrical conducting interconnections be created through the sublayers s by registering portions of electrical conducting material in the thin film. Under particular conditions can such electrical conducting or semiconducting structures be generated in situ in an already formed thin-film stack or they can be generated separately in each separate sublayer s which then is laminated or in another manner joined into a stack which forms a thin-film device 1. In PCT/NO99/00023 which belongs to the present applicant and which hereby is incorporated by reference, there is discussed a method for generation of horizontal and vertical electrical conducting structures in situ by means of radiation, for instance light radiation or particle radiation for thus creating three-dimensional electrical conducting and semiconducting structures in a stacked thin-film device. The generation of such structures can however also take place by means of electric fields which are applied patterned to the separate sublayers by means of a special generator/modulator device, such this is discussed in PCT/NO99/00022 which belongs to the present applicant and which also shall be incorporated by reference.

The apparatus according to the present invention is shown exploded in its main components in FIG. 10 where it appears with three thin-film devices $1_1$; $1_2$; $1_3$ and the interface area 4 provided in an edge portion of the thin-film devices. The apparatus in FIG. 10 is shown with the use of a substrate 13 which comprises not shown active electronic circuits and an interface 15 and also forms the I/O interface 12 for the whole apparatus. The use of a substrate 13 of this kind in the apparatus according to the present invention is however no condition, and the stacked configuration of the thin-film devices 1 may just as well be provided on a passive carrier substrate only, for instance formed of a foil-like material or a rigid material such as silicon.

The embodiment in FIG. 10 has similar features to corresponding embodiments as shown in the above-mentioned international patent application PCT/NO98/00185. In this patent application are disclosed in more detail matrix addressable memory means which will be suited for use in the apparatus according to the invention and it is also disclosed how circuits can be realized in stacked thin-film layers and with three-dimensional topology. This can for instance concern diodes, transistors, complementary transistor circuits and logic gates realized in thin-film technology, something which, however, shall not be discussed in more detail here. It is also to be understood that memories in the separate thin-film device can be configured as one or more of a number of memory types, viz. RAM, ROM, WORM, ERASABLE or REWRITEABLE or combinations of such memories. Also this is disclosed in detail in the above-mentioned patent application and shall hence not be further described here.

Each thin-film device 1 in the apparatus according to the invention can be built upon a proprietary separation layer 16 before the joining into a stacked configuration takes place. The separate sublayers in a thin-film device 1 can have a thickness well below 1 $\mu$m, for instance down to 0.1 $\mu$m, which implies that a thin-film device 1 provided on a carrier substrate or a substrate which well could correspond to the separation layer 16, together with this will constitute a component with a thickness of for instance 20 $\mu$m and may in that case comprise up to 100 sublayers, something which will be sufficient to realize relatively complicated electronic circuits in thin-film technology and simultaneously allow that tens of separate memories 3' can be stacked in each memory area 3. With a memory cell size of 1 $\mu m^2$ can then for instance a single memory of 1 $cm^2$ comprise $10^8$ memory cells of this kind and consequently store at least $10^8$ bit. A thin-film device the size of a credit card size will for instance comprise 40 such separate memories and hence store 0.5 Gbyte. When then the apparatus which for instance can be implemented as a PCMCIA-like card with 3 mm thickness, can comprise 100 stacked thin-film devices, it will be seen that the apparatus can store 50 Gbyte within the conditions given by the form factor. Further storage capacity can be obtained by better exploitation of the real estate of each thin-film device, that is increasing the dimensions of the memory areas 3, but also by a reduction in the size of the separate memory cell, as a size of at least down towards 0.25 $\mu$m×0.25 $\mu$m seems realistic. In that case the storage capacity straightforwardly could be increased to 800 Gbyte, and it will be seen that the apparatus according to the present invention thus realized might implement a mass storage device or a hard disk replacement which could be used in most of today's personal computers or workstations.

Under the conditions which follows from a given data storage density it would be seen that the total data storage density will be given by the form factor, the area and the thickness of the apparatus. Basically and practically scaling to a design storage capacity will take place by using a sufficient number of thin-film devices. Integrated in for instance a PCMCIA card type 3, the apparatus according to the invention could then replace a conventional hard disk memory in the card. Where a given standard does not place restrictions on the dimensions, could the apparatus according to the invention replace existing hard disk solutions in for instance personal computers and suitably scaled offer mass storage capacity in the Tbyte range.

Finally it shall be remarked that even though the apparatus according to the invention is realized in planar stacked configuration, it may also be thinkable that the stacked configuration has been formed with deviant geometries. As the thin films are made in a flexible material and if a substrate with active circuits and based on inorganic semiconductors is not used, but for instance only a flexible carrier substrate in a form of foil-like material, it is thinkable that the whole apparatus for instance may be rolled up into a cylinder or pipe like configuration if this was advantageous for the purpose. In any case it is evident that an apparatus according to the invention realized in flexible materials can be incorporated in other objects where the requirement for planeness or stiffness no longer is unavoidable and hence be used for implementing applications in completely different circumstances than those which are regarded to fall within the scope of conventional computer technology.

What is claimed is:

1. Scalable data processing apparatus, particularly a data storage apparatus, comprising one or more thin-film devices which form a substantially planar layer generated by a number of sublayers of thin film, wherein the sublayers of thin film comprise electrical isolating and/or conducting and/or semiconducting structures and structures with information storage capability realized in a thin-film material in a sublayer, wherein the structures register with or contact electrically other structures of this kind in adjacent sublayers for realizing active and passive electronic circuits elements or logic cells in the thin-film device, wherein the active and passive circuit elements in a thin-film device are realized with a three-dimensional architecture and extend through two or more sublayers, wherein the circuit elements are electrically connected by horizontal electrical conducting structures in one or more sublayers and vertical electrical conducting structures extending through one or more of the sublayers, and wherein two or more thin-film devices are provided as an integrated stack of the substantially planar layers which form the thin-film devices, such that the apparatus forms a stacked configuration, characterized in that each thin-film device comprises one ore more memory areas which form one or more matrix addressable memories, each with a memory medium in a sublayer in contact with a first electrode set in the form of stripe-like parallel electrical conducting structures or electrode structures and a second electrode set in the form of corresponding electrode structures oriented substantially orthogonal to the electrode structures in the first electrode set, the electrode sets respectively being provided in respective further sublayers adjacent to said sublayer on each side thereof, whereby addressable memory cells are created in the memory medium at the crossings between the electrode structures in the first and the second electrode set, that each thin-film device further comprises circuit areas which form electronic thin-film circuitry for controlling, driving and addressing the memory cells in one or more memories, said electronic circuitry being connected with electrode structures in respective the first and the second electrode set in a memory over current paths which are formed as electrical conducting structures in substantially the same sublayers wherein the electrode sets are provided, and that each thin film device has a respective interface to every other thin-film device in the apparatus, said interfaces being realized with communication and signal lines and supporting circuitry for processing which extends vertically through respective dedicated interface areas in the thin-film device.

2. Apparatus according to claim 1, characterized in that the memory medium in one or more memories comprises materials selected among molecular materials in the form of monomers, oligomers or polymers, carbon-containing materials in inorganic or organic form, or a juxtaposition or mixture of such materials.

3. Apparatus according to claim 2, characterized in that the memory medium comprises a memory material which in a memory cell provides a non-linear current/voltage characteristic, said non-linear current/voltage characteristic being generated by inorganic or organics diodes or a threshold-switchable material.

4. Apparatus according to claim 1, characterized in that the memory medium comprises a switchable material, said switchable material being a non-volatile material, selected as respectively a ferroelectric material or a charge transfer organic complex.

5. Apparatus according to claim 1, characterized in that the memory medium is switchable and has a non-linear current/voltage characteristic.

6. Apparatus according to claim 1, characterized in that the electronic circuitry comprises inorganic and/or organic semiconducting materials.

7. Apparatus according to claim 1, characterized in that the interface areas in one or more thin-film devices are provided integrated in an edge portion of this or these, said edge portions in the latter case registering mutually.

8. Apparatus according to claim 7, characterized in that the interface area in an edge portion additionally comprises an I/O interface for the respective thin-film device or optionally the apparatus as a whole, and implements functions for data and signal communication with external and/or peripheral devices.

9. Apparatus according to claim 1, characterized in that the thin-film device or the stacked configuration of such devices is provided on a substrate which comprises active electronic circuits for implementing additional control, driving and communication functions in the apparatus, each thin-film device being connected with a circuit over a separate interface area which in each case extends vertically through the thin-film devices which are located between a thin-film device in question and the substrate.

10. Apparatus according to claim 9, characterized in that the substrate comprises an interface portion which extends substantially horizontally in the substrate and parallel to and adjacent to the thereabove provided thin-film device and which is electrically connected with the interface portions in thin-film device or the thin-film devices provided above the substrate.

11. Apparatus according to claim 10, characterized in that the interface portion further comprises an I/O interface for the apparatus as a whole, said I/O interface implementing functions for data and signal communication with external and/or peripheral devices.

12. Apparatus according to claim 11, characterized in that the substrate is made in a semiconducting material, particularly an inorganic single crystal semiconducting material and even more particularly such a single crystal semiconducting material of silicon.

13. Apparatus according to claim 12, characterized in that the electronic circuits in the substrate are realized in CMOS-technology.

14. Apparatus according to claim 10, characterized in that electrical connections between the electronic circuits in the substrate and its interface portion or over this interface portion to the interface areas in the above lying thin-film devices are realized as CMOS-compatible metallic interconnections.

15. Apparatus according to claim 1, wherein the apparatus comprises two or more thin-film devices, characterized in that the thin-film devices are substantially conformal in the plane and provided mutually registering in the stacked configuration.

16. Apparatus according to claim 15, characterized in that one or more separation layers are provided interfoliated between adjacent thin-film devices and implementing either separately or in selected combinations respectively an electrical thermal, optical or mechanical isolating function or planarizing function, said interface areas in the respective thin-film devices in each case being electrically connected over vias in a respective separation layer.

17. Apparatus according to claim 1, wherein the apparatus comprises two or more thin-film devices, characterized in that the thin-film devices are provided mutually staggered in the stacked configuration.

18. Apparatus according to claim 17, characterized in that one or more separation layers are provided interfoliated between adjacent thin-film devices and separately or in selected combinations implement respectively an electrical, thermal, optical or mechanical isolating or a planarizing function, and that separation layers only are provided in the overlapping portion of two adjacent thin-film devices, the interface areas of the respective thin-film devices being provided above exposed surface portions of the thin-film devices in staggered area thereof, such that the separation layers between the thin-film devices form an unbroken layer without vias for electrical connections between the separate thin-film devices.

19. Apparatus according to claim 1, characterized in that the apparatus is provided on a carrier substrate formed of a foil-like material or a rigid material such as silicon, said carrier substrate in each case being provided adjacent to the lowermost thin-film device in the stacked configuration or an optionally provided substrate with electronic circuits.

20. A scalable data processing apparatus, particularly a data storage apparatus, comprising:

one or more thin-film devices which form a planar layer generated by a number of coextensive stacked sublayers of thin-film material, the sublayers of each thin-film device include electrical isolating and/or conducting and/or semiconducting structures and structures with information storage capability realized in the thin-film material in a sublayer, wherein the structures register with or contact electrically other structures of this kind in adjacent sublayers in the stack forming the thin-film device for realizing active and passive electronic circuit elements or logic cells in the thin-film device, wherein the active and passive circuit elements in a thin-film device are realized with a three-dimensional architecture and extend through two or more sublayers thereof, wherein the circuit elements are electrically connected by horizontal electrical conducting structures in one or more sublayers and vertical electrical conducting structures extending through one or more of the sublayers, and wherein two or more thin-film devices are provided in a stack, wherein each thin-film device includes one or more memory areas, which form one or more matrix addressable memories, each with a memory medium in a sublayer in contact with a first electrode set in the form of stripe-like parallel electrical conducting structures or electrode structures, and a second electrode set in the form of corresponding electrode structures oriented substantially orthogonal to the electrode structures of the first electrode set, the electrode sets respectively being provided in further sublayers adjoining said memory sublayer on each side thereof, whereby addressable memory cells are created in the memory medium at the crossings between the electrode structures in the first and the second electrode set, that each thin-film device further comprises circuit areas which form electronic thin-film circuitry for controlling, driving and addressing the memory cells in one or more memories, said electronic circuitry being connected with electrode structures in respectively the first and second electrode set in a memory via current paths which are formed as electrical conducting structures is substantially the same sublayers wherein the electrode sets are provided, and that each thin-film device has a respective interface to every other thin-film device in the apparatus, said interfaces being realized with communication and signal lines and supporting circuitry for processing said lines and circuitry being provided in respective dedicated interface areas in the thin film device.

21. Apparatus according to claim 20, wherein the memory medium in one or more memories comprises materials selected among molecular materials in the form of monomers, oligomers or polymers, carbon-containing materials in inorganic or organic form, or a juxtaposition or mixture of such materials.

22. Apparatus according to claim 21, wherein the memory medium comprises a memory material which in a memory cell provides a non-linear current/voltage characteristic, said non-linear current/voltage characteristic being generated by inorganic or organic diodes or a threshold switchable material.

23. Apparatus according to claim 20, wherein the memory medium comprises a switchable material, said switchable material being a non-volatile material, selected as respectively a ferroelectric material or a charge transfer organic complex.

24. Apparatus according to claim 20, wherein the memory medium is switchable and has a non-linear current/voltage characteristic.

25. Apparatus according to claim 20, wherein the electronic circuitry comprises inorganic and/or organic semiconducting materials.

26. Apparatus according to claim 20, wherein the interface areas in one or more thin-film devices are provided integrated in an edge portion of this or these, said edge portions in the latter case registering mutually.

27. Apparatus according to claim 26, wherein the interface area in an edge portion additionally comprises an I/O interface for the respective thin-film device or optionally the apparatus as a whole, and implements functions for data and signal communication with external and/or peripheral devices.

28. Apparatus according to claim 20, wherein the thin-film device or the stack of such devices is provided on a substrate which comprises active electrode circuits for implementing additional control, driving and communication functions in the apparatus, each thin-film device being connected with a circuit over a separate interface area which in each case extends vertically through the thin-film devices which are located between a thin-film device in question and the substrate.

29. Apparatus according to claim 28, wherein the substrate comprises an interface portion which extends horizontally in the substrate and parallel to and adjacent to the thereabove provided thin-film device and which is electrically connected with the interface portions in thin-film device or the thin-film devices provided above the substrate.

30. Apparatus according to claim 29, wherein the interface portion further comprises an I/O interface for the apparatus as a whole, said I/O interface implementing functions for data and signal communication with external and/or peripheral devices.

31. Apparatus according to claim 30, wherein the substrate is made in a semiconducting material, particularly an inorganic single crystal semiconducting material and even more particularly a such single crystal semiconducting material of silicon.

32. Apparatus according to claim 31, wherein the electronic circuits in the substrate are realized in CMOS-technology.

33. Apparatus according to claim 29, wherein electrical connections between the electronic circuits in the substrate and its interface portion or via this interface portion to the interface areas in the above-lying thin-film devices are realized as CMOS-compatible metallic interconnections.

34. Apparatus according to claim 20, wherein the apparatus comprises two or more thin-film devices, characterized in that the thin-film devices are coextensive and provided mutually registering the stack thereof.

35. Apparatus according to claim 34, wherein one or more separation layers are provided interfoliated between adjacent thin-film devices and implementing either separately or in selected combinations respectively an electrical, thermal, optical or mechanical isolating function or planarizing function, said interface areas in the respective thin-film devices in each case being electrically connected over vias in a respective separation layer.

36. Apparatus according to claim 20, wherein the apparatus comprises two or more thin-film devices, characterized in that the thin-film devices are provided mutually staggered in the stack thereof.

37. Apparatus according to claim 36, wherein electrical connections between the thin-film and/or between the thin-film devices and an optional substrate are provided extending horizontally and vertically over the steps in the staggered stack.

38. Apparatus according to claim 36, wherein one or more separation layers are provided interfoliated between adjacent thin-film devices and separately or in selected combinations implement respectively an electrical, thermal, optical or mechanical isolating or a planarizing function, and that separation layers only are provided in the overlapping portion of two adjacent thin-film devices, the interface areas of the respective thin-film devices being provided above exposed surface portions of the thin-film devices in the staggered area thereof, such that the separation layers between the thin-film devices form an unbroken layer without vias for electrical connections between the separate thin-film devices.

39. Apparatus according to claim 20, wherein the apparatus is provided on a carrier substrate formed of a foil-like material or a rigid material such as silicon, said carrier substrate in each case being provided adjacent to the lowermost thin-film device in the stack or an optionally provided substrate with electronic circuits.

40. A data storage apparatus comprising:
- at least one sublayer formed on a substrate, in which two or more combined sublayers form a stack;
- at least one thin film device, the at least one thin film device including,
- at least one memory area provided within the sublayer, each memory area having at least one memory element, each memory element being positioned parallel to other memory elements in a stacked position,
- first and second electrode sets connected to the memory element, the first and second electrode sets formed of multiple electrode strips, the first and second electrode sets positioned substantially orthogonal to each other, and
- at least one electric circuit located adjacent to the memory area and formed within one or more sublayers, each electric circuit being connected with the first and second electrode sets via current paths formed in substantially the same sublayers wherein the first and second electrode sets are positioned;
- wherein an interface connects the at least one thin film device with other thin film devices within the data storage apparatus.

41. The data storage apparatus of claim 40, wherein the interface is comprised of vertically positioned strips for providing a connection between various elements of the different sublayers and a horizontal strip of which the vertical strips may be electrically connected, the horizontal strip extending the length of the substrate.

42. The data storage apparatus of claim 40, wherein the at least one memory element is staggered respective of other memory elements within the at least one thin film device.

43. The data storage apparatus of claim 40, wherein separation layers are provided between memory areas.

44. A method of storing data within a data storage apparatus using thin film devices, comprising steps of:
- providing at least one memory area within the thin film device, the memory area provided in a sublayer which is positioned on a substrate, each memory area has a at least one memory element being positioned parallel to other memory elements in a stacked position;
- providing a first and second electrode set connected to the memory element, the first and second electrode sets formed of multiple electrode strips, the first and second electrode sets positioned substantially orthogonal to each other; and
- providing at least one electric circuit located adjacent to the memory area and formed within one or more sublayers, each electric circuit being connected with the first and second electrode sets via current paths formed in substantially the same sublayers wherein the first and second electrode sets are positioned;
- wherein an interface connects the at least one thin film device with other thin film devices within the data storage apparatus.

45. An data storage apparatus, comprising:
- a plurality of multi-bit matrix addressable memory elements, the memory elements including,
- a plurality of first and second strips, the plurality of first and second strips positioned perpendicular to one another, the intersection of the first and second strips forming a memory location;
- wherein the memory elements are positioned within one of a plurality of horizontal layers, the layers being stacked in such a manner as to form a staggered chevron pattern between the memory elements of the different layers.

46. The apparatus of claim 45, wherein the memory comprises mnaterials selected among molecular materials in the form of monomers, oligomers or polymers, carbon-containing materials in inorganic or organic form, or a juxtaposition or mixture of such materials.

47. The apparatus of claim 45, wherein the memory comprises a switchable material, said switchable material being a non-volatile material, selected as respectively a ferroelectric material or a charge trnasfer organic complex.

* * * * *